United States Patent
Feng et al.

(10) Patent No.: US 9,153,794 B2
(45) Date of Patent: Oct. 6, 2015

(54) THIN FILM ENCAPSULATION OF ORGANIC LIGHT EMITTING DIODES

(75) Inventors: Edward Feng, Shanghai (CN); Jianhua Zhang, Shanghai (CN)

(73) Assignee: Linde Aktiengesellschaft, Munich (DE)

( * ) Notice: Subject to any disclaimer, the term of this patent is extended or adjusted under 35 U.S.C. 154(b) by 43 days.

(21) Appl. No.: 14/003,373

(22) PCT Filed: May 11, 2011

(86) PCT No.: PCT/CN2011/073910
§ 371 (c)(1),
(2), (4) Date: Mar. 11, 2014

(87) PCT Pub. No.: WO2012/151744
PCT Pub. Date: Nov. 15, 2012

(65) Prior Publication Data
US 2015/0125975 A1     May 7, 2015

(51) Int. Cl.
| | |
|---|---|
| H01L 51/44 | (2006.01) |
| H01L 51/56 | (2006.01) |
| H01L 51/52 | (2006.01) |
| H01L 51/00 | (2006.01) |

(52) U.S. Cl.
CPC ........... *H01L 51/56* (2013.01); *H01L 51/0021* (2013.01); *H01L 51/5206* (2013.01); *H01L 51/5221* (2013.01); *H01L 51/5231* (2013.01); *H01L 51/5237* (2013.01); *H01L 51/5253* (2013.01)

(58) Field of Classification Search
CPC ............. H10L 21/56; H10L 21/02348; H10L 21/0231; H10L 21/02178; H10L 51/5287; H10L 51/5296; H10L 51/5012

USPC ......... 438/99, 82, 85, 91, 104, 106, 112, 124, 438/127, 141, 308, 328, 463, 474, 475, 608, 438/688
See application file for complete search history.

(56) References Cited

U.S. PATENT DOCUMENTS

| | | | |
|---|---|---|---|
| 7,709,842 B2 * | 5/2010 | Jung et al. | 257/59 |
| 8,603,869 B2 * | 12/2013 | Ro et al. | 438/158 |
| 2004/0032206 A1 * | 2/2004 | Weaver et al. | 313/504 |
| 2004/0081852 A1 * | 4/2004 | Chen et al. | 428/690 |
| 2005/0164589 A1 | 7/2005 | Ghosh | |
| 2007/0057624 A1 * | 3/2007 | Angelopoulos et al. | 313/503 |
| 2010/0164369 A1 | 7/2010 | Yeh et al. | |

FOREIGN PATENT DOCUMENTS

| | | |
|---|---|---|
| CN | 101079473 A | 11/2007 |
| CN | 101483222 A | 7/2009 |
| JP | 2008108515 A | 5/2008 |

* cited by examiner

*Primary Examiner* — David Nhu
(74) *Attorney, Agent, or Firm* — David A. Hey

(57) ABSTRACT

A low temperature, low cost method of encapsulating organic light emitting diodes (OLED) that avoids damage to the OLED device. A metal passivation layer is formed using a plasma, UV-ozone, or wet chemical treatment, wherein the metal passivation layer serves to encapsulate and protect the OLED from moisture and oxygen. Alternatively, a buffer layer and a metal layer are formed onto the OLED and the metal layer is treated using a plasma, UV-ozone, or wet chemical treatment, to form a metal passivation layer that serves to encapsulate and protect the OLED from moisture and oxygen.

15 Claims, 3 Drawing Sheets

THIN FILM ENCAPSULATION OF ORGANIC LIGHT EMITTING DIODES

FIELD OF THE INVENTION

The present invention relates to new methods for the encapsulation of organic light emitting diodes (OLED).

BACKGROUND OF THE INVENTION

OLEDs are a type of light emitting diode in which the emissive electroluminescent layer is a film of an organic compound that emits light in response to an electric current. The organic material is sandwiched between two electrodes at least one being a transparent electrode. OLEDs exhibit high luminescence, high efficiency and require low driving voltage and are therefore good candidates for use in display screens, e.g. for televisions, computer monitors, mobile phone screens, etc. OLEDs can effectively be used for large panel areas and full color displays with extremely high resolution.

However, the use of OLEDs for displays requires special treatment. In particular, exposure to moisture or oxygen can do extensive damage to the organic luminescent layer. Therefore, encapsulation of the OLED is critical to protect the device from moisture and oxygen. There are several methods used for encapsulation, but all of them have disadvantages. In particular, one method of encapsulating OLEDs is to cover the device with a metal or glass layer secured by an epoxy resin. A desiccant material, such as calcium oxide or barium oxide is normally incorporated into the device when using an adhesively attached metal or glass encapsulation layer. This method of encapsulation is high in cost and fairly low in effectiveness. It also results in a final device having a relatively high profile.

Another method of encapsulating OLEDs is to use an inorganic, organic or hybrid layer; e.g. $SiN_x$, $SiO_x$ or $Al_2O_3$ deposited onto the device. This layer may be deposited by any one of many standard deposition techniques, including chemical vapor deposition (CVD), physical vapor deposition (PVD), or atomic layer deposition (ALD). All of these deposition techniques require temperatures that exceed the normal limits of the OLED device and therefore may damage the device, especially the organic luminescent layer during processing. Further the equipment required for such depositions is costly and deposition times are relatively long thereby adding significant cost to the manufacturing of the devices.

Therefore, there is a need in the art for improvements to encapsulation techniques for OLEDs.

SUMMARY OF THE INVENTION

The present invention provides a low temperature, low cost method of encapsulating OLEDs that avoids damage to the OLED device

DETAILED DESCRIPTION OF THE INVENTION

Figure 1:
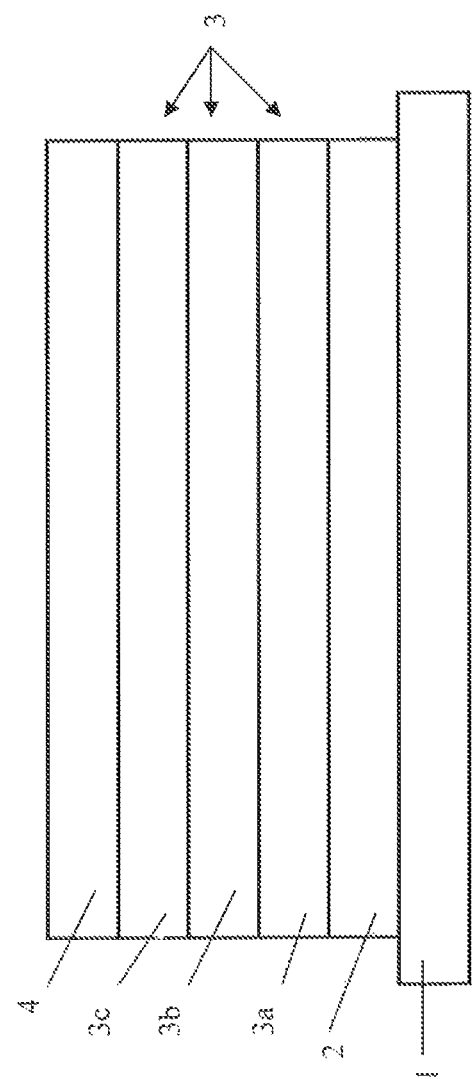
FIG. 1 is a schematic drawing showing an OLED device.

The present invention provides a low temperature, low cost method of encapsulating OLEDs that avoids damage to the OLED device. In particular, one embodiment of the present invention provides a method of forming a metal passivation layer using a plasma, UV-ozone, or wet chemical treatment, wherein the metal passivation layer serves to encapsulate and protect the OLED from moisture and oxygen.

A second embodiment of the present invention provides a method of forming a buffer layer and a metal layer onto the OLED structure that is then treated using a plasma, UV-ozone, or wet chemical treatment, to form a metal passivation layer that serves to encapsulate and protect the OLED from moisture and oxygen. The present invention will be described in greater detail with reference to the drawing figures.

FIG. 1 is a schematic drawing showing an OLED device. In particular, the OLED device comprises a substrate 1, having an anode layer 2, formed thereon. An organic electroluminescent layer 3, is formed on top of the anode layer 2, and a cathode layer 4, covers the organic layer 3, to complete the OLED device. The anode layer 2 is typically formed from indium tin oxide and the cathode layer 4 is usually made of aluminum. The organic layer 3, is composed of three separate layers; a hole transport layer (HTL) 3a, a light emitting layer (EML) 3b, and an electron transport layer (ETL) 3c.

Figure 2:
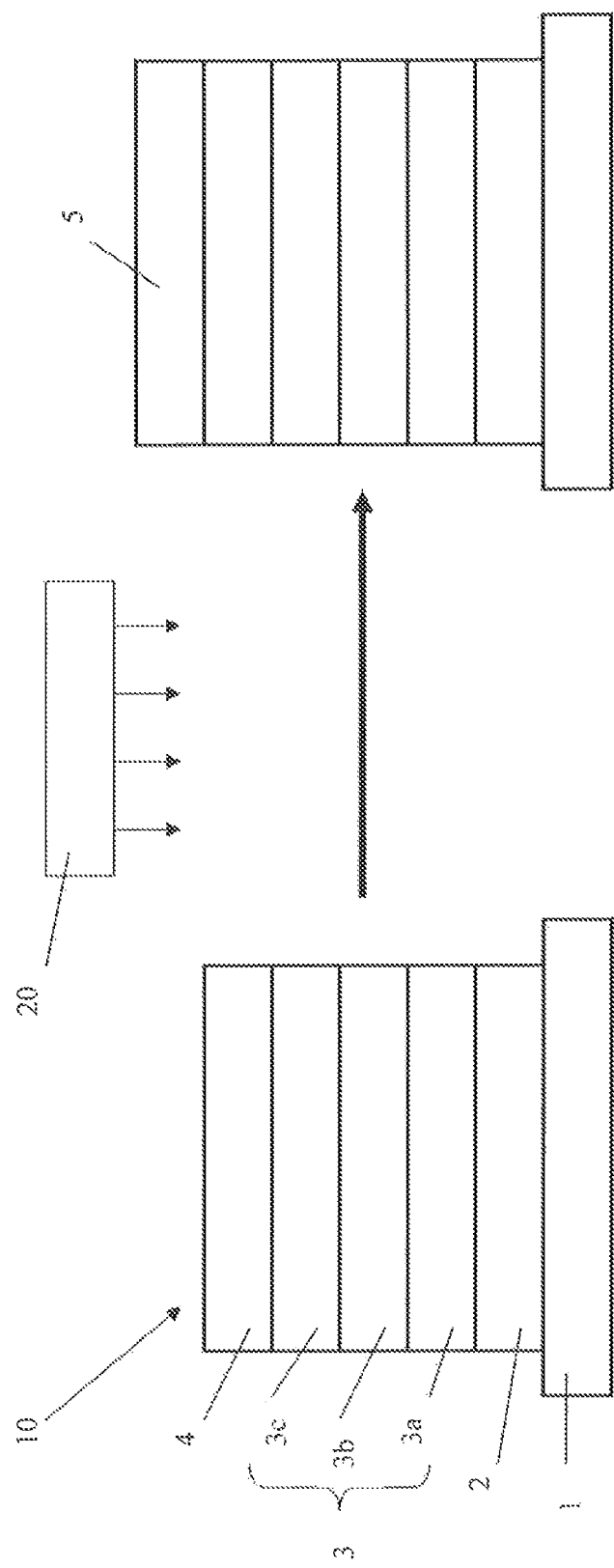
FIG. 2 is a schematic drawing showing a process for encapsulating an OLED according to one embodiment of the present invention.

FIG. 2 is a schematic drawing showing a process for encapsulating an OLED according to one embodiment of the present invention. In particular, a fabricated OLED device 10, having the layers shown in FIG. 1; i.e. substrate 1, anode layer 2, organic electroluminescent layer 3 (with HTL 3a, EML 3b, and ETL 3c), and cathode layer 4, is subjected to treatment from treatment means 20 to produce a passivation layer 5, on the surface of the cathode layer 4. For example, if the cathode layer 4 is an aluminum layer, then the passivation layer 5, will be a metal alumina oxide film. The passivation layer 5, encapsulates the OLED 10, and protects it from moisture and oxygen.

In accordance with the present invention, the treatment means 20, can be any means that provides for oxidation of the cathode layer 4, at temperatures that do not harm the OLED 10. For example, the treatment means 20, may be a plasma, UV-ozone, or wet chemical treatment means. In accordance with a particular embodiment of the present invention, the treatment means 20, is a UV source and the OLED 10, is treated in a UV chamber and the metal cathode 4, is exposed to UV light for 10 to 30 minutes.

Figure 3:
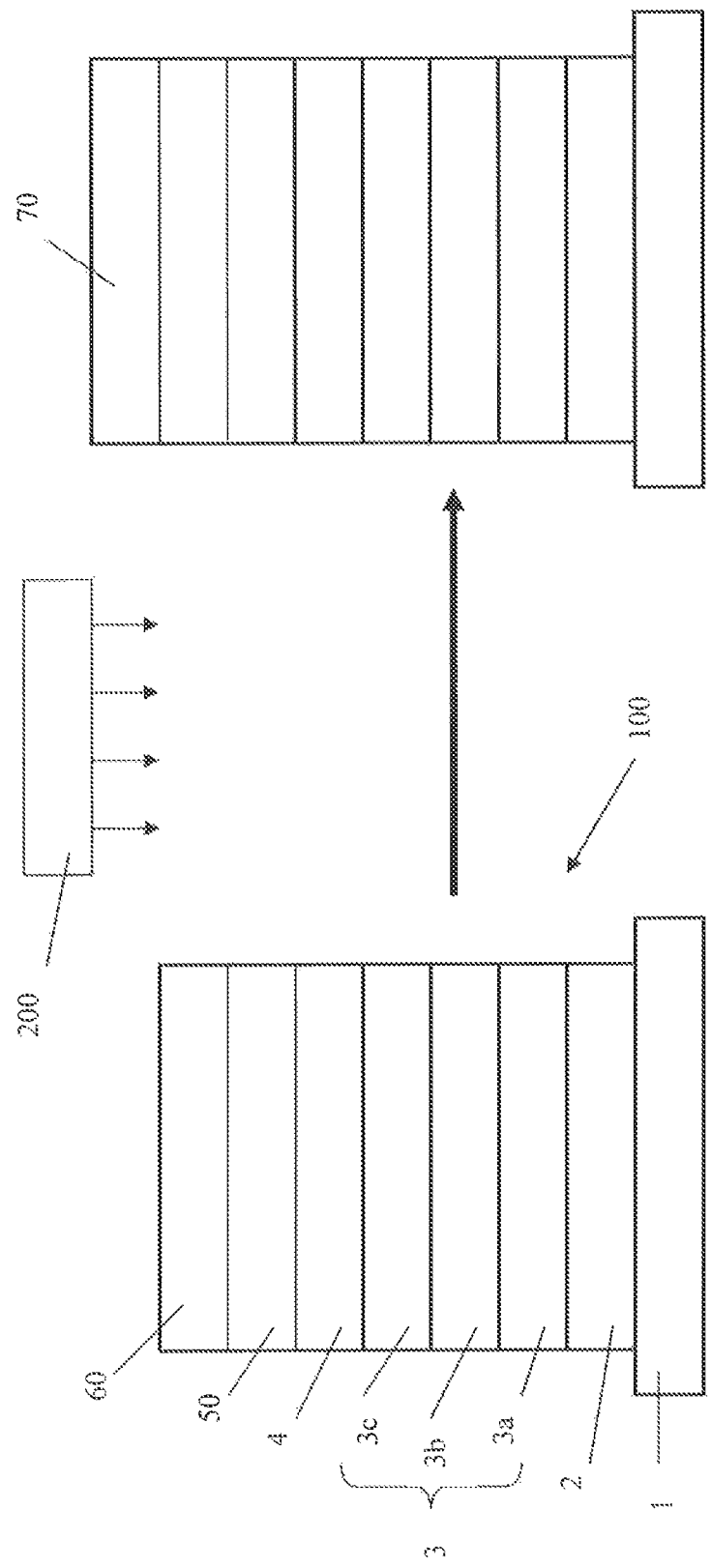
FIG. 3 is a schematic drawing showing a process for encapsulating an OLED according to a second embodiment of the present invention.

FIG. 3 is a schematic drawing showing a process for encapsulating an OLED according to another embodiment of the present invention. In particular, a fabricated OLED device 100, having the layers shown in FIG. 1; i.e. substrate 1, anode layer 2, organic electroluminescent layer 3 (with HTL 3a, EML 3b, and ETL 3c), and cathode layer 4, has a buffer layer 50, and a metal layer 60 formed thereon. This assembly is then subjected to treatment from treatment means 200 to produce a passivation layer 70. The buffer layer 50, may be a ZnS layer and the metal layer 60, may be an aluminum layer. Both layers can be generated by evaporation, if the metal layer 60 is an aluminum layer, then the passivation layer 70, will be a metal alumina oxide film. The passivation layer 70, encapsulates the OLED 100, and protects it from moisture and oxygen.

In accordance with the present invention, the treatment means 200, can be any means that provides for oxidation of the metal layer 60, at temperatures that do not harm the OLED 100. For example, the treatment means 200, may be a plasma, UV-ozone, or wet chemical treatment means. In particular, the present invention can comprise the following stages:

Buffer layer 50, fabrication by evaporation to produce layer thickness of about 100 nm;

Metal layer 60, fabrication by evaporation to produce layer thickness of about 30 nm;

Placing OLED device 100, in a UV chamber; and

Exposing the metal layer 60, to UV light for 10 to 30 minutes.

The present invention provides several advantages over the prior art encapsulation methods. For example, the process of creating a metal passivation layer, or of forming a buffer layer and a metal layer followed by creation of a metal passivation layer according to the present invention is a simple process and can easily be used in mass production. In addition, the process temperature is low, thus avoiding damage to the OLED device. Moreover, no new equipment is necessary to carry out the process, thereby significantly reducing capital costs. Also, less processing and transport time is needed so that a higher output and consequent lower operating costs can be achieved.

It will be understood that the embodiments described herein are merely exemplary and that one skilled in the art may make variations and modifications without departing from the spirit and scope of the present invention. All such variations and modifications are intended to be included within the scope of the invention as described above. Further, all embodiments disclosed are not necessarily in the alternative, as various embodiments of the invention may be combined to provide the desired result.

What is claimed is:

1. A method for encapsulating an organic light emitting diode (OLED) device, the method comprising:
   providing a fabricated organic light emitting diode having a substrate, an anode layer formed on the substrate, an organic electroluminescent layer formed on the anode layer, and a cathode layer formed on the organic electroluminescent layer; and
   treating the cathode layer to produce a passivation layer on a surface of the cathode layer
   wherein treating comprises treating with plasma, UN-ozone, or wet chemicals.

2. The method of claim 1 wherein the anode layer is an indium tin oxide layer.

3. The method of claim 1 wherein the cathode layer is an aluminum layer.

4. The method of claim 1 wherein the organic electroluminescent layer is composed of a hole transport layer, a light emitting layer and an electron transport layer.

5. A method for encapsulating an organic light emitting diode (OLED) device, the method comprising:
   providing a fabricated organic light emitting diode having a substrate, an anode layer formed on the substrate, an organic electroluminescent layer formed on the anode layer, and a cathode layer formed on the organic electroluminescent layer;
   forming a buffer layer on the cathode layer;
   forming a metal layer on the buffer layer; and
   treating the metal layer to produce a passivation layer on a surface of the metal layer.

6. The method claim 5 wherein the anode layer is an indium tin oxide layer.

7. The method of claim 5 wherein the cathode layer is an aluminum layer.

8. The method of claim 5 wherein the organic electroluminescent layer is composed of a hole transport layer, a light emitting layer and an electron transport layer.

9. The method of claim 5 wherein the buffer layer is a ZnS layer.

10. The method of claim 5 wherein the metal layer is an aluminum layer.

11. The method of claim 5 wherein the buffer layer and the metal layer are generated by evaporation.

12. The method of claim 5 wherein treating comprises treating with plasma, UV-ozone, or wet chemicals.

13. The method of claim 5 wherein treating comprises exposing the metal layer to UV light for 10 to 30 minutes.

14. The method of claim 5 wherein forming the buffer layer comprises evaporating the buffer layer to a thickness of 100 nm; harming the metal layer comprises evaporating the metal layer to a thickness of 30 nm; and treating comprises exposing the metal layer to UV light for 10 to 30 minutes.

15. A method for encapsulating an organic light emitting diode (OLED) device; the method comprising:
   providing a fabricated organic light emitting diode having a substrate, an anode layer formed on the substrate, an organic electroluminescent layer formed on the anode layer, and a cathode layer formed on the organic electroluminescent layer; and
   treating the cathode layer to produce a passivation layer on a surface of the cathode layer
   wherein treating comprises exposing the cathode layer to UV light for 10 to 30 minutes.

* * * * *